United States Patent
Magnee et al.

(10) Patent No.: US 7,074,685 B2
(45) Date of Patent: Jul. 11, 2006

(54) METHOD OF FABRICATION SIGE HETEROJUNCTION BIPOLAR TRANSISTOR

(75) Inventors: Petrus Hubertus Cornelis Magnee, Leuven (BE); Johannes Josephus Theodorus Marinus Donkers, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/515,763

(22) PCT Filed: May 27, 2003

(86) PCT No.: PCT/IB03/02034

§ 371 (c)(1),
(2), (4) Date: Nov. 24, 2004

(87) PCT Pub. No.: WO03/100845

PCT Pub. Date: Dec. 4, 2003

(65) Prior Publication Data

US 2005/0218399 A1 Oct. 6, 2005

(30) Foreign Application Priority Data

May 29, 2002 (EP) .................. 02077112

(51) Int. Cl.
*H01L 21/331* (2006.01)
*H01L 21/36* (2006.01)

(52) U.S. Cl. ............ 438/312; 438/318; 438/341; 438/349; 438/489

(58) Field of Classification Search ........ 438/312, 438/341, 348, 349, 365, 366, 481, 489, 318
See application file for complete search history.

(56) References Cited

U.S. PATENT DOCUMENTS

| | | | |
|---|---|---|---|
| 5,101,256 A * | 3/1992 | Harame et al. | 257/565 |
| 6,169,007 B1 * | 1/2001 | Pinter | 438/320 |
| 6,664,574 B1 * | 12/2003 | Azam et al. | 257/197 |
| 6,806,158 B1 * | 10/2004 | Sukegawa et al. | 438/309 |
| 2002/0000664 A1 * | 1/2002 | Cheng et al. | 257/758 |

* cited by examiner

Primary Examiner—Trung Dang
(74) Attorney, Agent, or Firm—Peter Zawilski

(57) ABSTRACT

A method of fabricating a semiconductor device includes a SiGe(C) heterojunction bipolar transistor using a non-selective epitaxial growth where an insulating layer is formed on a substrate and a layer structure including a conductive layer is provided on the insulating layer. A transistor area opening is etched through the conductive layer, and an SiGe base layer is deposited inside the transistor area opening. An insulator is formed on an upper surface so as to fill the transistor area opening, wherein prior to filling the opening, a nitride layer is formed as an inner layer of the transistor area opening.

10 Claims, 7 Drawing Sheets

METHOD OF FABRICATION SIGE HETEROJUNCTION BIPOLAR TRANSISTOR

Figure 1:
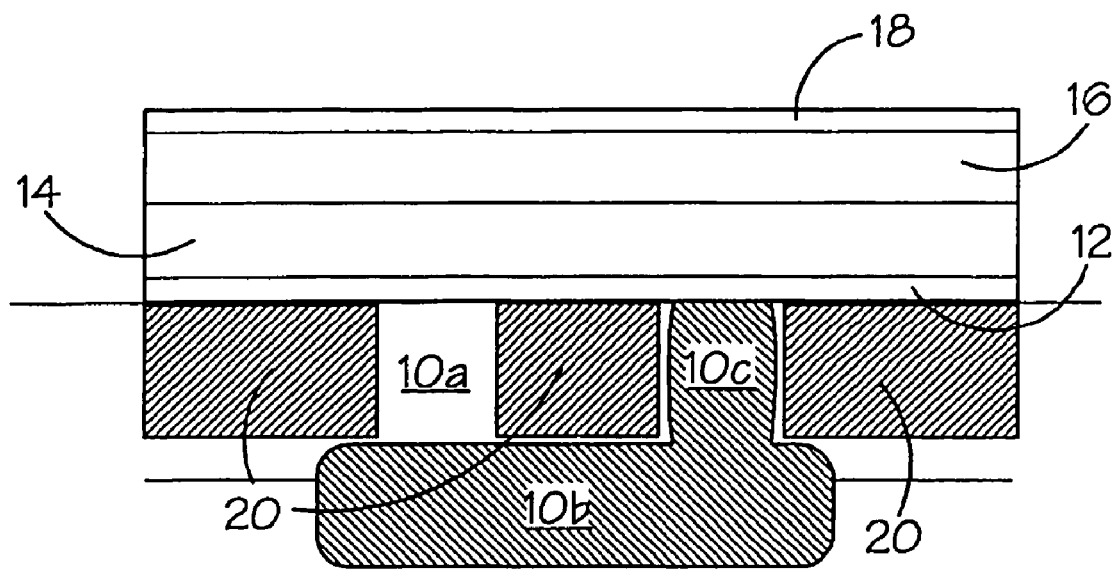

The present invention relates to the fabrication of a semiconductor device comprising a SiGe heterojunction bipolar transistor, including a bipolar transistor such as a SiGeC heterojunction bipolar transistor.

In particular, the present invention relates to a method of fabricating a semiconductor device comprising a SiGe(C) heterojunction bipolar transistor using a non-selective epitaxial growth including the steps of forming an insulating layer on a substrate, providing a layer structure including a conductive layer on the insulating layer, etching a transistor area opening through the conductive layer, depositing a SiGe base layer inside the transistor area opening, and including the step of filling the transistor area opening with an insulator which is to be subsequently etched.

In this manner, the present invention can relate to a SiGe(C) heterojunction bipolar transistor using non-selective epitaxial growth, an intrinsic SiGe base layer is grown inside a window in a stack consisting of thermal oxide, B-doped poly-silicon, TEOS and amorphous silicon, wherein the B-doped poly-silicon is employed for formation of the extrinsic base contact.

Such a process is known from U.S. Pat. No. 6,169,007 which discloses a method of fabricating a self-aligned non-selective thin-epi-base SiGe heterojunction bipolar transistor in which a TEOS or spin-on-glass silicon dioxide etch back is used. The manner of fabrication disclosed in this document seeks to provide for the fabrication of the transistor such that it is self-aligned to a single mask since this can lead to transistors exhibiting smaller device areas while exhibiting reduced parasitic problems. There are currently known two different integration schemes for the integration of, for example, a SiGe and including a SiGeC, heterojunction bipolar transistor. The first is based upon a double-poly structure and employs selective epitaxial growth in a cavity underneath the base-poly-silicon in order to form an extrinsic base contact. The second is based upon non-selective, or differential, epitaxial growth, in which poly-SiGe is grown on field oxide regions of the structure and mono-SiGe is grown in the active area. In this second known scheme, the extrinsic base contact is formed by the poly-silicon grown on the field oxide.

The first scheme mentioned above which relies on selective epitaxial growth exhibits a disadvantageous loading effect. The chemical concentrations concerned depend heavily on the density of the active area and it is found that the growth rate may vary in response to circuit layout. Such problems do not generally arise with non-selective epitaxial growth since the growth is arranged to take place over the whole exposed surface area, i.e. on the field oxide and on the bare mono-silicon material in the transistor area.

Although the subject matter of U.S. Pat. No. 6,169,007 exhibits the above-mentioned advantages of smaller transistor size and lower parasitic capacitances it nevertheless exhibits disadvantages in relation to the fabrication technique disclosed.

In particular, in such a known process, to prevent the SiGe base layer from being oxidized, or otherwise damaged, by steps subsequent to its deposition, several sacrificial layers and protective spacers are used.

The present invention seeks to provide for a method of fabricating a semiconductor device comprising a non-selectively grown SiGe(C) heterojunction bipolar transistor, which method exhibits advantages over known such methods.

According to the present invention, there is provided a method of fabricating a semiconductor device comprising a non-selectively grown SiGe(C) heterojunction bipolar transistor as described above, wherein prior to the said filling of the transistor area opening, a nitride layer is formed as an inner layer of the transistor area opening.

The invention is advantageous in that, through the particular location of the nitride layer, the nitride in the transistor area opening remains after the insulator has been etched and can serve to prevent the SiGe base layer from being oxidized, or otherwise damaged, in subsequent fabrication steps.

Advantages include eliminating the need for several sacrificial layers, or protective nitride spacers, since the SiGe base layer can be simply and effectively isolated.

Further advantages include eliminating the need for a plurality of dummy layers deposited and subsequently etched, since the re-oxidation of the SiGeC overcomes the need for such repeated acts.

Other advantages include that a readily self-aligned selectively implanted collector can be provided which allows for the collector doping level just below the emitter to be increased for improved RF performance. Such improvements are advantageously achieved without necessarily increasing the collector doping levels in the extrinsic part of the device then formed. This further serves to advantageously limit extrinsic parasitic related problems.

Further advantages include providing for simplicity and accuracy of fabrication while limiting the number of depositions required.

Another advantage includes assisting with isolation of the base layer and the conductive layer.

It is another advantage that the structure then formed can exhibit narrow, but sufficiently filled, openings. Further, the etching of the nitride to form L-spacers can be adapted in relation to the act of the formation of the selectively-implanted-collector.

It should therefore be appreciated from the above that the present invention provides for a method of fabricating a non-selectively grown SiGe heterojunction bipolar transistor in which all contacts, emitter, base and collector are formed fully self-aligned to one single mask. In particular, the selectively-implanted-collector can also be provided self-aligned to this single mask. The structure can then exhibit a relatively small transistor area which can be fabricated in a particularly advantageous manner.

The invention is described further hereinafter, by way of example only, with reference to the accompanying drawings in which:

FIGS. 1–9 illustrate various stages in the fabrication of a non-selectively grown SiGe heterojunction bipolar transistor according to an embodiment of the present invention; and FIGS. 10 to 14 illustrate various stages in the fabrication of a non-selectively grown SiGe heterojunction bipolar transistor according to another embodiment of the present invention.

FIG. 1 illustrates an initial structure comprising a standard BiCMOS p-doped substrate 10 exhibiting a buried collector contact 10$b$, an N-type collector epitaxial layer 10$a$ and an n-plug sinker 10$c$ for providing contact between the surface and the buried n-layer collector contact 10$b$. Finally there are provided field isolation regions in the form of two regions of shallow-trench isolation 20. On top of the substrate 10 there is grown a thermal oxide layer 12, next a stack consisting of a boron insitu-doped poly-silicon deposited layer 14, a TEOS layer 16 and a layer of amorphous-silicon 18.

Figure 2:
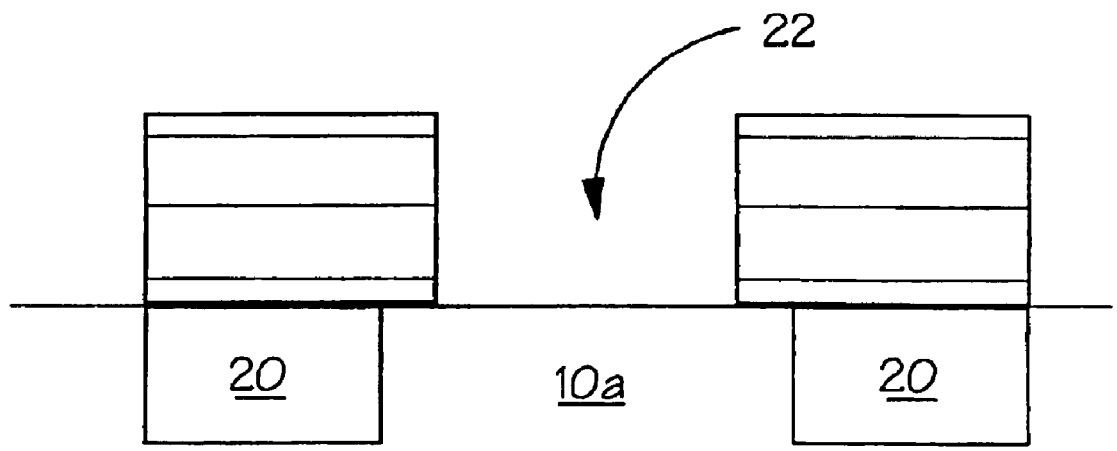
Figure 3:
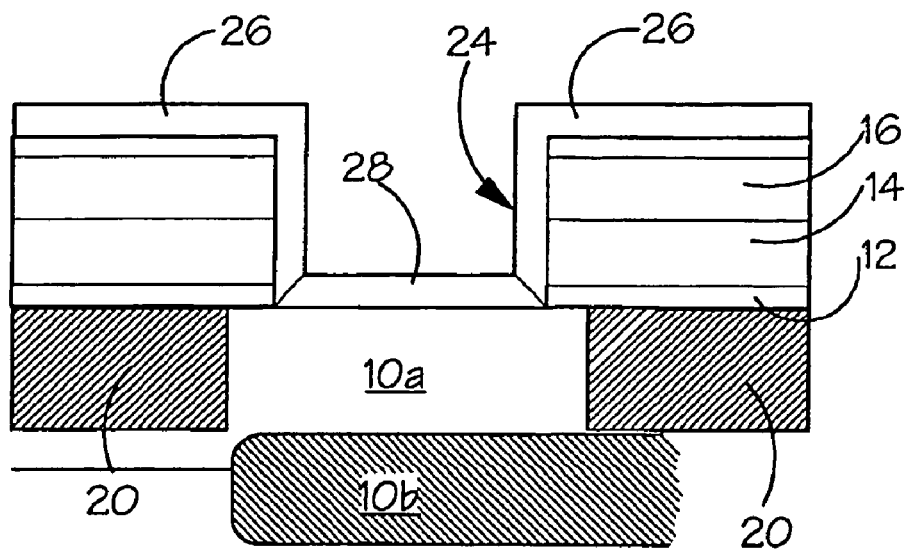

Turning now to FIG. 2, which is an enlarged detail of the active area, the transistor area 22 is then opened by etching a well through the entire layered stack formed above the thermal oxide layer 12. This step is achieved by way of a plasma etch step which serves to etch through the amorphous silicon layer 18, the TEOS layer 16 and the poly-silicon layer 14. The thermal oxide 12 serves as an effective stop layer for the plasma etch. The thermal oxide layer 12 then requires subsequent removal by, for example, a selective wet-etching step.

It is an important feature of the invention that the transistor opening area 22 is formed entirely within the confines of the shallow trench isolation regions 20 so it is thus located in the transistor's active area. However, apart from initial alignment tolerances, no further overlay between the active area and the transistor area is required.

The substrate illustrated with reference to the enlarged detail of the active area of FIG. 2 is shown, for purposes of clarity, in slightly less detail so as to emphasize that, importantly, the transistor window is only slightly smaller than the active area defined by the opening in the field oxide.

A selective collector implant is preferably carried out prior to wet-etching of the thin oxide layer 12.

Subsequent to the formation of the transistor opening area 22 as illustrated in FIG. 2, a SiGeC base layer 24 is deposited by means of differential epitaxial growth. The upper amorphous silicon layer 18 acts in this process step as a seed layer such that these lateral portions 26 of the base layer are formed as a poly-SiGeC layer. However, on the area of the transistor opening, the base layer comprises regions of epitaxial SiGeC 28 as illustrated with reference to FIG. 3. This occurs since the poly SiGeC is deposited in polycrystalline form everywhere except at locations of exposed mono-crystalline silicon 22, where the SiGeC layer grows epitaxially.

As an important step of the present invention, the base layer 24 is then covered by means of a nitride layer 30 which, if thought appropriate, can be separated from the base layer 24 by means of a thin pad-oxide layer not shown in the illustrated embodiment.

Figure 4:
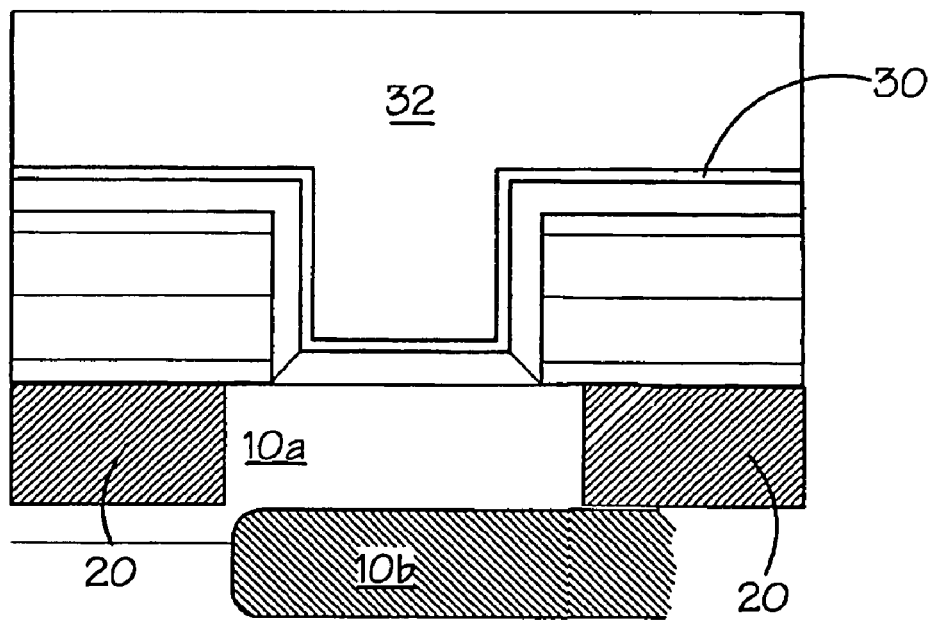

Subsequent to the formation of the nitride layer 30 as illustrated in FIG. 4 it is covered with a thick Chemical Vapour Deposition (CVD) oxide layer 32. This layer 32 is required to fill the transistor opening area 22 and so preferably a High Density Plasma deposition (HDP) oxide is employed for layer 32, so as to achieve enhanced step coverage.

Figure 5:
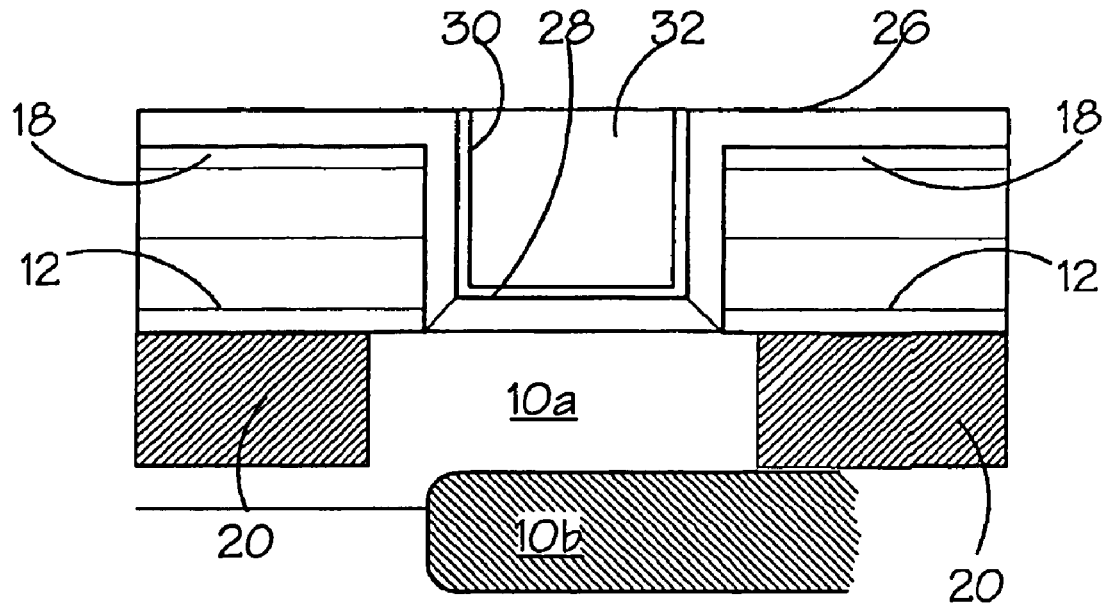

Turning now to FIG. 5, it can be seen that the next steps in the fabrication process involve the removal of the HDP-oxide 32 from above the stack structure by means of chemical-mechanical polishing such that the HDP-oxide 32 is left only in the transistor opening area. With HDP-oxide 32 acting as a masking layer, the nitride layer 30 outside of the transistor opening area 32 is then etched so as to arrive at the structure illustrated in FIG. 5. Subsequent to this, the HDP oxide 32 is removed completely from within the transistor opening area and, while then employing the remaining nitride layer 30 as a masking layer, the poly-SiGeC portions 26 of the base layer 24 are etched, as indeed is the amorphous silicon layer 18.

Figure 6:
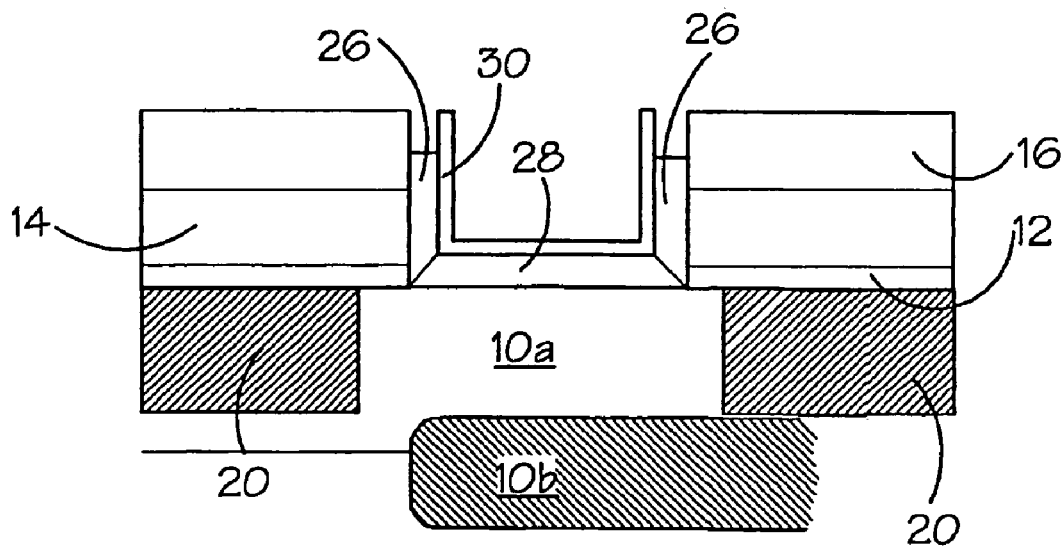
Figure 7:
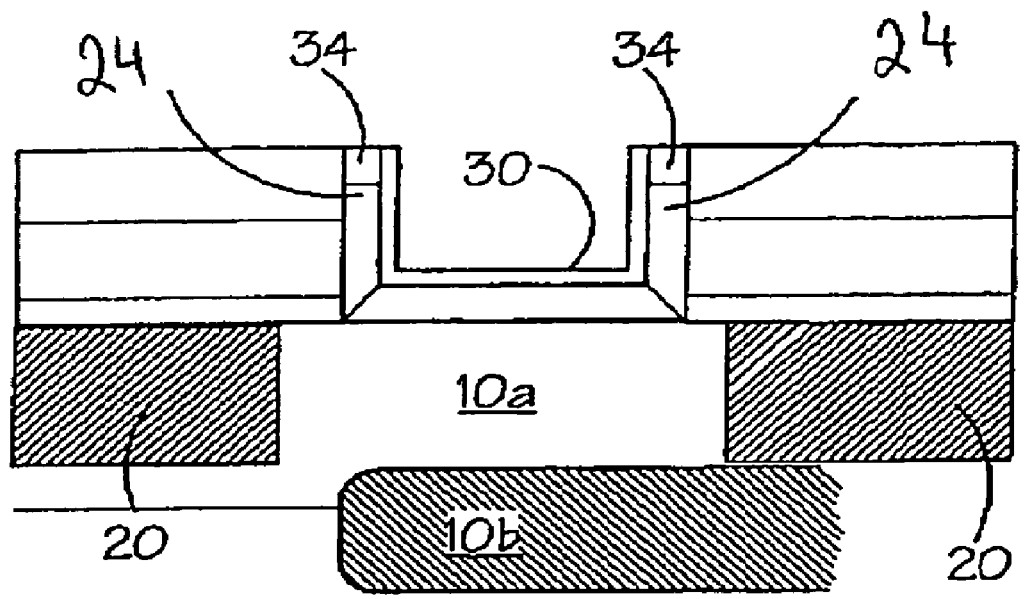

The structure illustrated in FIG. 6 is then arrived at with the TEOS layer 16 forming the upper layer of the structure and with sidewall portions of the base layer 24, i.e. lower portions of the poly-SiGeC base 26 formed beneath the upper level of the protecting nitride side regions of the protective nitride layer 30 defined within the transistor opening area.

The nitride 30 is then employed as a mask for an oxidation step in which thermal oxide 34 is advantageously formed above the poly-SiGeC portions 26 of the base layer 24. Advantageously, rather than requiring the deposition and etching of multiple dummy layers, the invention provides re-oxidation of the top poly SiGeC region.

Figure 8:
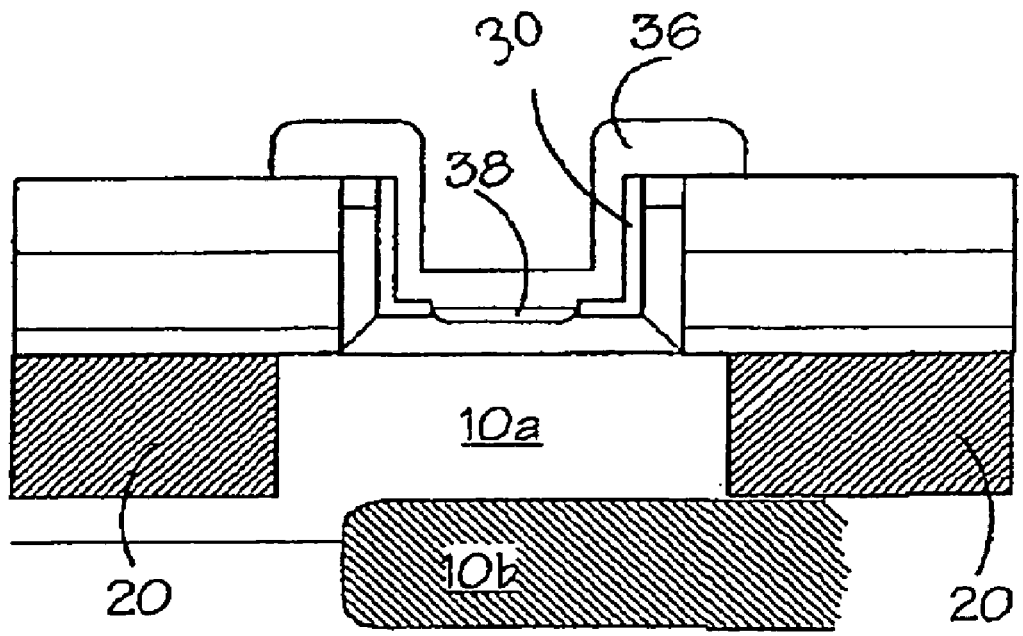

The provision of such protective thermal oxide in this manner serving to isolate the top of the base layer 24 proves a particularly advantageous step avoiding the provision of unnecessary sacrificial layers and nitride spacers as required in the prior-art. Such a structure is illustrated with reference to FIG. 7. Next, dummy spacers are employed to form the L-spacers as illustrated in FIG. 8. An arsenic insitu-doped poly-silicon layer 36 is then deposited to form the emitter contact so that the cross-section is then as illustrated in FIG. 8.

Figure 9:
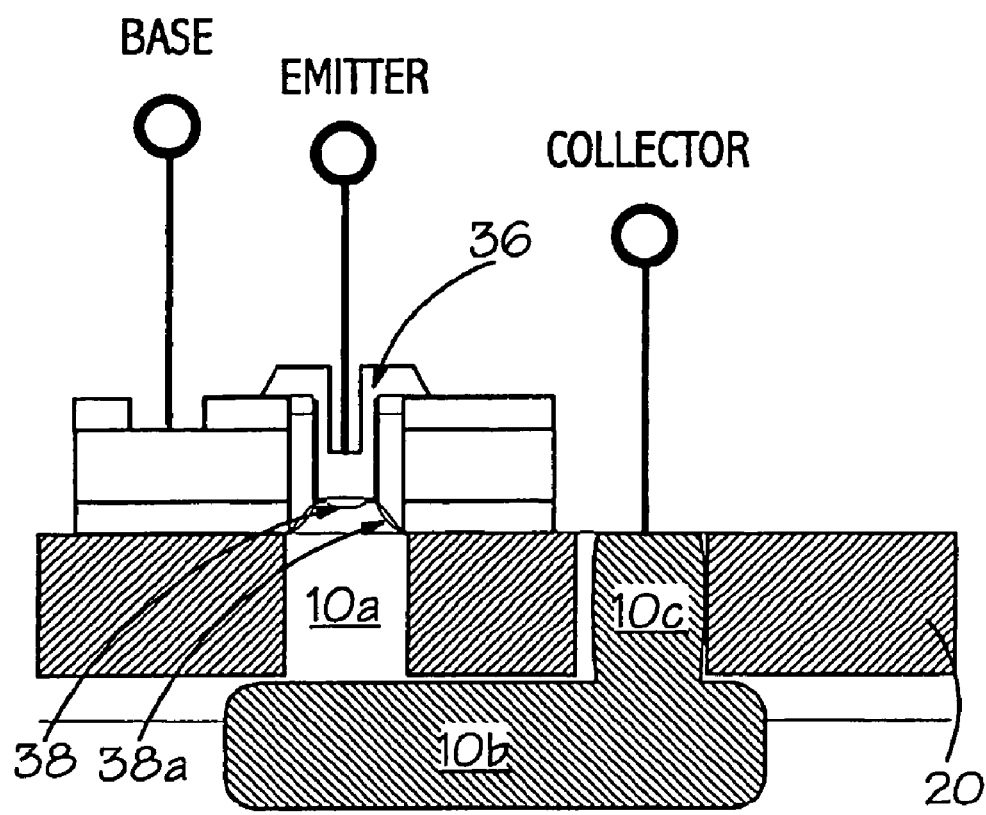

FIG. 9 illustrates an example of a final form of the transistor but excluding metalization.

During the emitter anneal, arsenic from, for example, the arsenic in-situ doped poly-silicon 36 is diffused so as to form the emitter 38 as illustrated in FIGS. 8 and 9.

At the same time, Boron from the Boron in-situ doped poly-silicon 14 is diffused across the boundary formed between the poly SiGeC base 26 and the epitaxial SiGeC 28, in order to form an extrinsic base-link 38a also illustrated with reference to FIG. 9.

Turning now to FIGS. 10 to 14, there are illustrated fabrication steps according to another embodiment of the invention.

Figure 10:
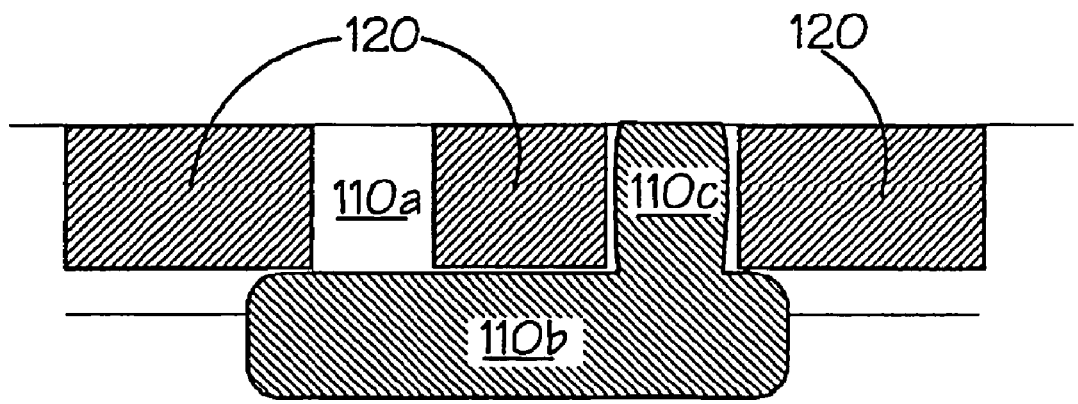

Turning first to FIG. 10, there is illustrated a substrate structure as a starting point for both embodiments, and so this substrate structure is similar to that of the previous embodiment as illustrated in FIG. 1 but prior to the formation of any structure on the substrate. The substrate configuration is again an n-doped collector epitaxial layer 110a grown above a collector contact 110b and with an n-plug sinker 110c for providing contact between the surface of the substrate and the buried n-layer collector contact 110b. Shallow trench isolation regions 120 are formed where indicated.

Figure 11:
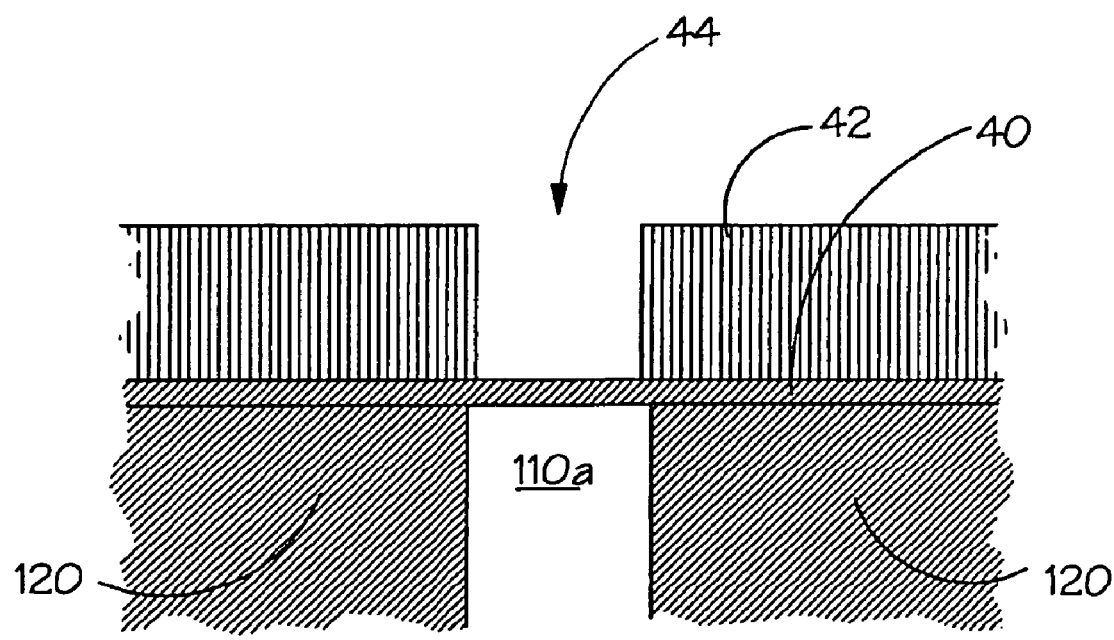

Turning now to FIG. 11, the next stage in this alternative embodiment comprises the formation of an insulating layer 40 preferably in the form of thermal oxide grown to a depth in the region of 20 nm. A relatively thick conductive layer 42 preferably of B-doped poly-silicon is then deposited to a depth in the order of 200–300 nm and a window 44 is etched in the poly-silicon layer 42 above the active area of the transistor. Prior to the epitaxial growth of the, for example, SiGeC base layer, the thin oxide layer 40 within the opening window 44 can be dipped away as required.

Figure 12:
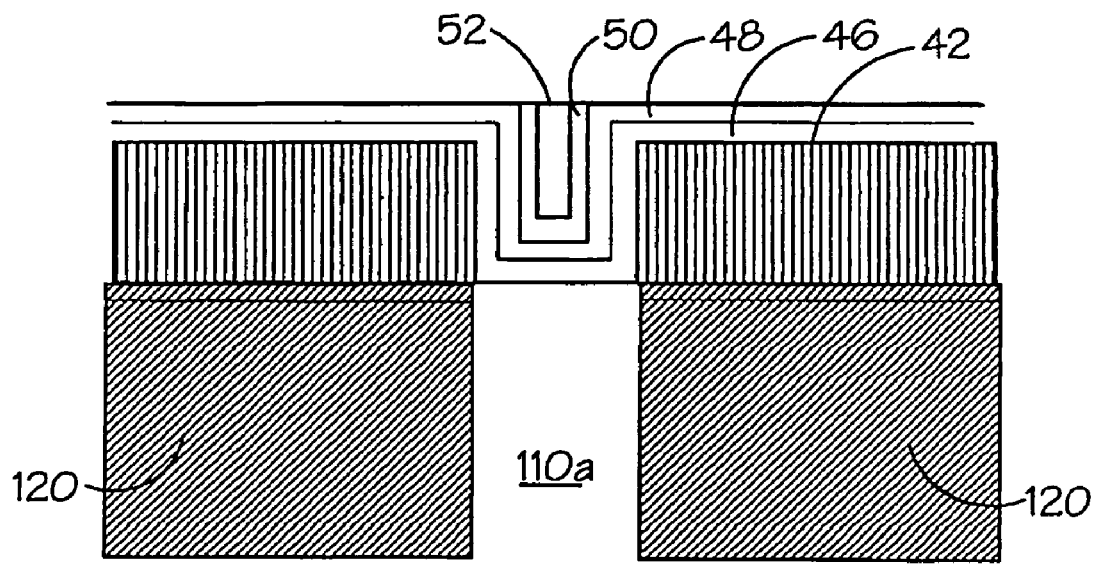

In this Figure, the SiGeC base layer 46 is illustrated together with an overlaying emitter capping layer grown in a non-selective epitaxial manner as illustrated in FIG. 12. The SiGeC base layer 46 and the silicon-emitter cap layer 48 not only overlay the poly-silicon layer 42, but also form inner layers in the transistor opening 44.

A stack of nitride 50 and oxide 52 is then deposited over the entire structure but the upper regions thereof, as with the first embodiment illustrated hereinbefore, can be removed by means of chemical mechanical polishing.

Next, while using the remaining oxide as a masking layer, the nitride layer 50 is etched from regions above the poly-silicon 42 so as to arrive at the structure as illustrated in FIG. 12.

At this stage, and as an option depending on the emitter capping layer thickness and the desired oxide thickness, the SiGeC base layer 46 and the silicon-emitter cap layer 48 can be etched using the oxide 52 and nitride 50 as a masking layer. It is preferred to retain the epitaxial silicon-emitter cap layer 48 over the SiGeC base layer 46 if the desired oxide thickness can be formed using only the silicon-emitter cap. If, however, the silicon-emitter cap layer 48 becomes to thin, it is generally then preferred that it be removed altogether along with the regions of the SiGeC base layer 46 overlaying the poly-silicon layer 42.

In any case, the HDP oxide can then be dipped away and, assuming both the silicon-emitter cap layer 48 and the SiGeC base layer 46 have been removed from above the poly-silicon layer 42, the structure then arrived at is illustrated with reference to FIG. 13 wherein, however, a thermal oxide layer 54 has been grown over the poly-silicon layer 42 and up to and adjacent to the remaining nitride layer 50. This thermal oxide is preferably grown using a wet oxidation process at a lower temperature, thereby minimizing the effect of dopant diffusion while still having a reasonable oxide growth rate. A so-called thermal oxide, $SiO_2$, is grown by oxidizing the silicon surface. This can be done using a pure oxygen, $O_2$, ambient (dry oxidation), or in vapour, $H_2O$ (wet oxidation). The latter has the benefit that the diffusion of the $H_2O$ or $HO^-$ molecule through the already formed $SiO_2$ layer is much faster, because of the smaller size. Therefore, at a given temperature, the wet-oxidation growth rate is almost always higher than the dry-oxidation growth rate. The growth-rate increases for both methods with increasing temperature. Dopant diffusion is a temperature activated process, meaning: the higher the temperature the more dopant diffusion occurs. Hence, to get a reasonable oxide thickness and at the same time limited dopant, in this case boron, diffusion a wet-oxidation is preferred.

Figure 13:
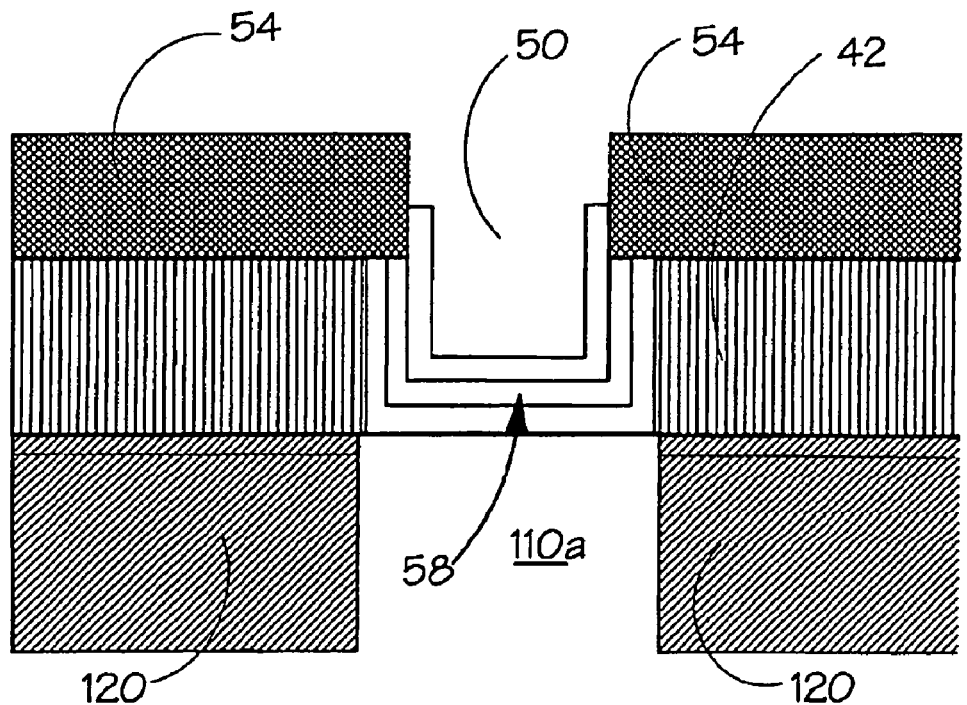

Depending upon the actual emitter-window and thus, the requirement for inside spacers, the nitride U-shaped cup 50 as illustrated in FIG. 13 can be employed for the formation of inside L-spacers, removed or indeed replaced by a thinner nitride layer. If required, the inside nitride L-spacers can be formed using standard technology.

Figure 14:
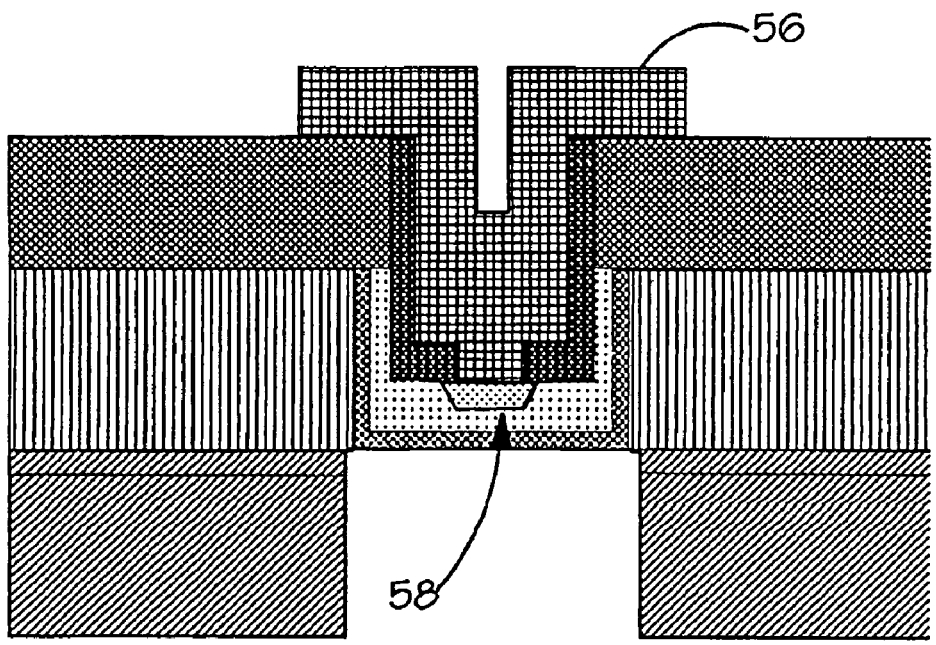

In processing the structure further, as with the earlier embodiment, an n-doped layer 56 can be deposited and a rapid thermal anneal conducted so as to form the emitter region 58 as illustrated in FIG. 14.

Standard processing of the structure illustrated in FIG. 14 can then be continued and can include patterning the base-poly-silicon, forming salicide on the emitter- and base-poly-silicon and on the collector sinker, and then completing the structure with a back-end interconnect.

This second embodiment of the present invention is particularly advantageous in allowing for yet further reduction of the required processing steps as compared with the prior art discussed previously.

The entire transistor, extrinsic base contact, SIC and emitter can then be formed self-aligned to a single mask and in a manner which limits damage to the layers formed within the transistor opening area in an advantageous manner.

The invention claimed is:

1. A method of fabricating a semiconductor device comprising an SiGe heterojunction bipolar transistor using a non-selective epitaxial growth including the acts of forming an insulating layer on a substrate and providing a layer structure including a conductive layer on the insulating layer, etching a transistor area opening through the conductive layer, depositing a SiGe base layer inside the transistor area opening and forming an insulator on an upper surface so as to fill the transistor area opening, wherein prior to the filling step, a nitride layer is formed as an inner layer of the transistor area opening, removing an upper portion of said insulator formed on said upper surface, and etching the SiGe base layer whilst employing the nitride layer formed within the transistor area opening as a mask.

2. The method as claimed in claim 1 including the acts of forming insulating regions to replace etched upper sidewall regions of the SiGe base layer.

3. The method as claimed in claim 2 and including the act of re-oxidation of the upper sidewall region of the SiGe base layer.

4. A method of fabricating a semiconductor device comprising an SiGe heterojunction bipolar transistor using a non-selective epitaxial growth including the acts of forming an insulating layer on a substrate and providing a layer structure including a conductive layer on the insulating layer, etching a transistor area opening through the conductive layer, depositing a SiGe base layer inside the transistor area opening and forming an insulator on an upper surface so as to fill the transistor area opening, wherein prior to the filling step, a nitride layer is formed as an inner layer of the transistor area opening wherein, prior to the deposition of the SiGe base layer, a selective collector region is implanted in the substrate aligned with the transistor area opening.

5. A method of fabricating a semiconductor device comprising an SiGe heterojunction bipolar transistor using a non-selective epitaxial growth including the acts of forming an insulating layer on a substrate and providing a layer structure including a conductive layer on the insulating layer, etching a transistor area opening through the conductive layer, depositing a SiGe base layer inside the transistor area opening and forming an insulator on an upper surface so as to fill the transistor area opening, wherein prior to the filling step, a nitride layer is formed as an inner layer of the transistor area opening, wherein the multi-layer structure includes a layer of TEOS and amorphous silicon formed on the conductive layer.

6. A method of fabricating a semiconductor device comprising an SiGe heterojunction bipolar transistor using a non-selective epitaxial growth including the acts of forming an insulating layer on a substrate and providing a layer structure including a conductive layer on the insulating layer, etching a transistor area opening through the conductive layer, depositing a SiGe base layer inside the transistor area opening and forming an insulator on an upper surface so as to fill the transistor area opening, wherein prior to the filling step, a nitride layer is formed as an inner layer of the transistor area opening, wherein said SiGe base layer is formed on an inner wall of the transistor area opening and over said conductive layer, and wherein a silicon-emitter cap layer is formed on the SiGe base layer such that the nitride layer is then formed on the silicon-emitter cap layer.

7. The method as claimed in claim 6, and including the acts of etching the nitride using the insulator formed to fill the transistor area opening as a mask.

8. The method as claimed in claim 6, and including the step of etching the silicon-emitter cap layer and the SiGe base layer while using the oxide formed to fill the transistor area opening, and the nitride layer as a mask.

9. The method as claimed in claim 6, and including the acts of removing the silicon emitter cap layer and the SiGe base layer from regions away from the transistor area opening.

10. The method as claimed in claim 8, and including the acts of forming a further insulating layer over the conductive layer.

* * * * *